(12) United States Patent
Regl et al.

(10) Patent No.: US 11,785,704 B2
(45) Date of Patent: Oct. 10, 2023

(54) COVER FOR PRESSING A PRINTED-CIRCUIT BOARD ON A HEAT SINK

(71) Applicant: HARMAN BECKER AUTOMOTIVE SYSTEMS GmbH, Karlsbad-Ittersbach (DE)

(72) Inventors: Hans-Juergen Regl, Bogen (DE); Alexander Mieslinger, Freising (DE)

(73) Assignee: Harman Becker Automotive Systems GMBH, Karlsbad-Ittersbach (DE)

( * ) Notice: Subject to any disclaimer, the term of this patent is extended or adjusted under 35 U.S.C. 154(b) by 28 days.

(21) Appl. No.: 17/389,550

(22) Filed: Jul. 30, 2021

(65) Prior Publication Data

US 2022/0039249 A1 Feb. 3, 2022

(30) Foreign Application Priority Data

Jul. 31, 2020 (DE) .......................... 102020120326.8

(51) Int. Cl.
*H05K 1/02* (2006.01)
*H05K 3/00* (2006.01)

(52) U.S. Cl.
CPC ......... *H05K 1/0209* (2013.01); *H05K 3/0008* (2013.01)

(58) Field of Classification Search
CPC ..... H05K 3/0008; H05K 9/0024–0037; H05K 1/0201–0203; H05K 1/0209–0212; H05K 1/0243; H05K 2201/0707; H05K 2201/09818; H05K 7/2039; H05K 7/2049; H05K 7/20154; H05K 7/20509; H05K 7/205; H05K 7/10436–20454; H01L 23/34–3677; H01L 2023/4037; H01L 2023/405; H01L 2023/4075–4087; H01R 13/6581; H01R 13/65914; H01R 13/6594–6597; G06F 1/20

See application file for complete search history.

(56) References Cited

U.S. PATENT DOCUMENTS

| | | | |
|---|---|---|---|
| 8,199,509 B2* | 6/2012 | Akabori ................. | G06F 1/184 165/185 |
| 2004/0031673 A1* | 2/2004 | Levy .................... | H01H 13/702 200/521 |
| 2007/0039811 A1* | 2/2007 | Yanai .................... | H01H 13/48 200/406 |
| 2008/0186681 A1* | 8/2008 | Deck .................... | H01L 23/4006 361/719 |

(Continued)

*Primary Examiner* — Amir A Jalali
(74) *Attorney, Agent, or Firm* — Artegis Law Group, LLP

(57) ABSTRACT

Provided is a cover for pressing a printed circuit board on a heat sink, the cover comprising a metal sheet and one or more domes arranged in the metal sheet, wherein each dome is associated with one or more slits in the shape of ring segments in the metal sheet, the ring segment-shaped slits being provided in the metal sheet side by side and spaced apart from each other, the ring segment-shaped slits surrounding the dome they are associated with. At least at one end of each ring segment-shaped slit a slit extension may be provided in the metal sheet, the slit extension at least in part pointing away from the dome the ring segment-shaped slit is associated with. Further provided is an electronic appliance that includes such a cover, a heat sink and an electronic circuit board sandwiched there between.

14 Claims, 6 Drawing Sheets

(56) References Cited

U.S. PATENT DOCUMENTS

| | | | |
|---|---|---|---|
| 2008/0296141 A1* | 12/2008 | Ogatsu | H01H 13/7065 200/535 |
| 2009/0266699 A1* | 10/2009 | Rothkopf | H05K 3/323 200/534 |
| 2010/0165579 A1* | 7/2010 | Li | H05K 1/0271 361/719 |
| 2010/0245231 A1* | 9/2010 | Aramaki | G06F 3/041 345/156 |
| 2010/0290194 A1* | 11/2010 | Wu | H01L 23/4093 361/709 |
| 2010/0315785 A1* | 12/2010 | Akabori | G06F 1/185 361/709 |
| 2011/0000775 A1* | 1/2011 | Itou | H01H 13/705 200/520 |
| 2014/0110237 A1* | 4/2014 | Enomoto | H01H 13/85 200/513 |

* cited by examiner

COVER FOR PRESSING A PRINTED-CIRCUIT BOARD ON A HEAT SINK

CROSS-REFERENCE TO RELATED APPLICATION(S)

This application claims the benefit of German Patent Application No. 102020120326.8, titled "Cover for Pressing a Printed-Circuit Board on a Heat Sink," and filed on Jul. 31, 2020. The subject matter of which is incorporated by reference herein in its entirety.

BACKGROUND

Field of the Various Embodiments

The present disclosure relates to a cover for pressing a printed circuit board on a heat sink, and to an electronic appliance with such a cover. The electronic appliance may, for example, be an amplifier that may be employed in a vehicle but is not limited thereto.

DESCRIPTION OF THE RELATED ART

Printed circuit boards such as used in amplifiers or other electronic appliances are typically arranged between a heat sink and a cover pressing the printed circuit board against the heat sink. The heat sink usually includes several cooling fins for dissipating the heat generated by integrated circuits (ICs), in particular the power ICs, and other electronic components on the printed circuit board (PCB). The cover usually includes a thin metal sheet with a multitude of domes embossed therein. The domes are directed towards the printed circuit board, and press/push onto specific spots on the printed circuit board, the specific spots corresponding to locations of ICs or other heat-generating electronic components on the printed circuit board. With the domes pressing onto the specific spots, and thereby onto the heat-generating components of the printed circuit board, the heat generating components are pressed against the heat sink.

However, dimensional differences in the height of the ICs and the other heat-generating components, and variations in the dimensions of the heat sink and the shape of the metal sheet of the cover after mounting often lead to deviations in the pressure exerted by the domes and may even result in situations where the domes are not contact with the ICs and the other heat-generating components. The cover and the heat sink are typically mounted by means of screws which may result in warping or dishing of the metal sheet cover. To avoid such deformations of the cover reinforcement ribs are often integrated into the cover for stiffening to minimize warping of the metal sheet. Moreover, the height of the domes may be chosen larger than seems necessary in the un-mounted state to account for distortions/warping during mounting. However, the contact pressure achieved is often not uniform.

SUMMARY

The present disclosure relates to a cover for pressing a printed circuit board on a heat sink. The cover comprises a metal sheet and one or more domes arranged in the metal sheet. The metal sheet includes the one or more domes. Each of the domes points in the same direction. The metal sheet and the one or more domes may form one piece. Each dome is associated with one or more slits in the shape of ring segments that are provided in the metal sheet. These ring segment-shaped slits are provided in the metal sheet side by side and spaced apart from each other. The ring segment-shaped slits surround the dome they are associated with/assigned to. I.e., the ring segment-shaped slits are arranged on a circle encircling the respective dome. On the circle the ring segment-shaped slits are arranged at a distance to each other, and may be equally distributed on the circle. With the ring segment-shaped slits being arranged at a distance to each other, spokes are provided in the metal sheet, the spokes connecting the respective dome with the (rest of the) metal sheet. The spokes may extend in the radial direction, or may be inclined at a predefined angle, or may be bended or curved by corresponding design of the ends of the ring segment-shaped slits.

At least at one end of each ring segment-shaped slit a slit extension may be provided in the metal sheet, the slit extension at least in part pointing away from the respective dome. At each ring segment-shaped slit the slit extension may be provided at the same end.

The slit extension of each ring segment-shaped slit may be formed such that at least part of it partially encircles the neighboring ring segment-shaped slit, with the slit extension being spaced apart from the neighboring ring segment-shaped slit. Therein the slit extension may encircle less than half of the neighboring ring segment-shaped slit. The slit extension of each ring segment-shaped slit may comprise a first slit extension part and a second slit extension part. The first slit extension part may extend away from the respective dome. The first slit extension part may extend in a radial direction, may be inclined at a predefined angle, or may be bended or curved. The second slit extension part may extend from the end of the first slit extension part that is opposite to the end that is connected to the ring segment-shaped slit. The second slit extension part may have a ring segment shape, and may extend in parallel or helically to and spaced apart from the neighboring ring segment-shaped slit.

Alternatively, slit extensions may be provided at both ends of each ring segment-shaped slit. The slit extensions may extend in a radial direction away from the respective dome. The slit extensions may also be inclined at a predefined angle, or may be bended or curved. Slit extensions provided at different ends of a ring segment-shaped slit may be mirror-inverted to each other, i.e., they may be axially symmetrically with respect to a radial direction/axis. A groove, for example in form of a notch or furrow, may be provided in the metal sheet between two adjacent slit extensions of neighboring ring segment-shaped slits. The longitudinal direction of the groove may be perpendicular to the longitudinal direction of the slit extensions. The groove may connect the adjacent slit extensions. The groove is indented in the same direction as the dome.

The present disclosure further relates to an electronic appliance comprising a cover as described herein, a heat sink and an electronic circuit board. The electronic circuit board is sandwiched between the cover and the heat sink such that the domes of the cover press the electronic circuit board, i.e., its integrated circuits and other heat-generating electronic components, against the heat sink for heat transfer and heat dissipating. An amplifier, such as an amplifier employed in a vehicle, may, for example, constitute an electronic appliance in the sense of the present disclosure. Other electronic appliances are possible.

By means of the ring segment-shaped slits and, in particular, the slit extensions the domes are de-coupled from the metal sheet of the cover. I.e. those zones are de-coupled from the metal sheet of the cover that may need to flex when pushing a printed circuit board of an electronic appliance against a heat sink. With the domes pushing against the specific locations of the printed circuit board where integrated circuits and other heat-generating electronic components are located, appropriate thermal contact of the integrated circuits and the other heat-generating electronic components with the heat sink can be achieved, thereby supporting heat transfer and dissipating. By de-coupling the domes from the metal sheet warping of the metal sheet can be avoided or at least reduced.

In case the integrated circuits and other heat-generating electronic components of the printed circuit board are of different heights, such height differences can be compensated for by appropriate spring suspension of the domes in the metal sheet of the cover. The spring suspension is realized by providing the ring segment-shaped slits and, in particular, the slit extensions in the metal sheet of the cover. Especially by providing slit extensions of different shapes and different dimensions, the spring behavior of the domes can be adjusted individually to provide individually adapted pressures/compressive forces/spring forces in order to account for such height differences without impairing heat transfer to the heat sink. I.e., with the cover of the present disclosure appropriate thermal contact of integrated circuits and other heat-generating electronic components of different heights with the heat sink can be ensured.

The ring segment-shaped slits and slit extensions can be fully integrated into existing metal sheets with integrated domes with basically no increase in costs and effort. Through the de-coupling of the domes from the metal sheet demands on the production and mounting accuracy of further mechanical components of the cover may be relaxed; tolerances may be larger.

BRIEF DESCRIPTION OF THE DRAWINGS

So that the manner in which the above recited features of the various embodiments can be understood in detail, a more particular description of the inventive concepts, briefly summarized above, can be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments. It is further noted that the appended drawings are not drawn to scale and like reference numerals refer to similar elements.

DETAILED DESCRIPTION OF THE PREFERRED EMBODIMENTS

Figure 1:
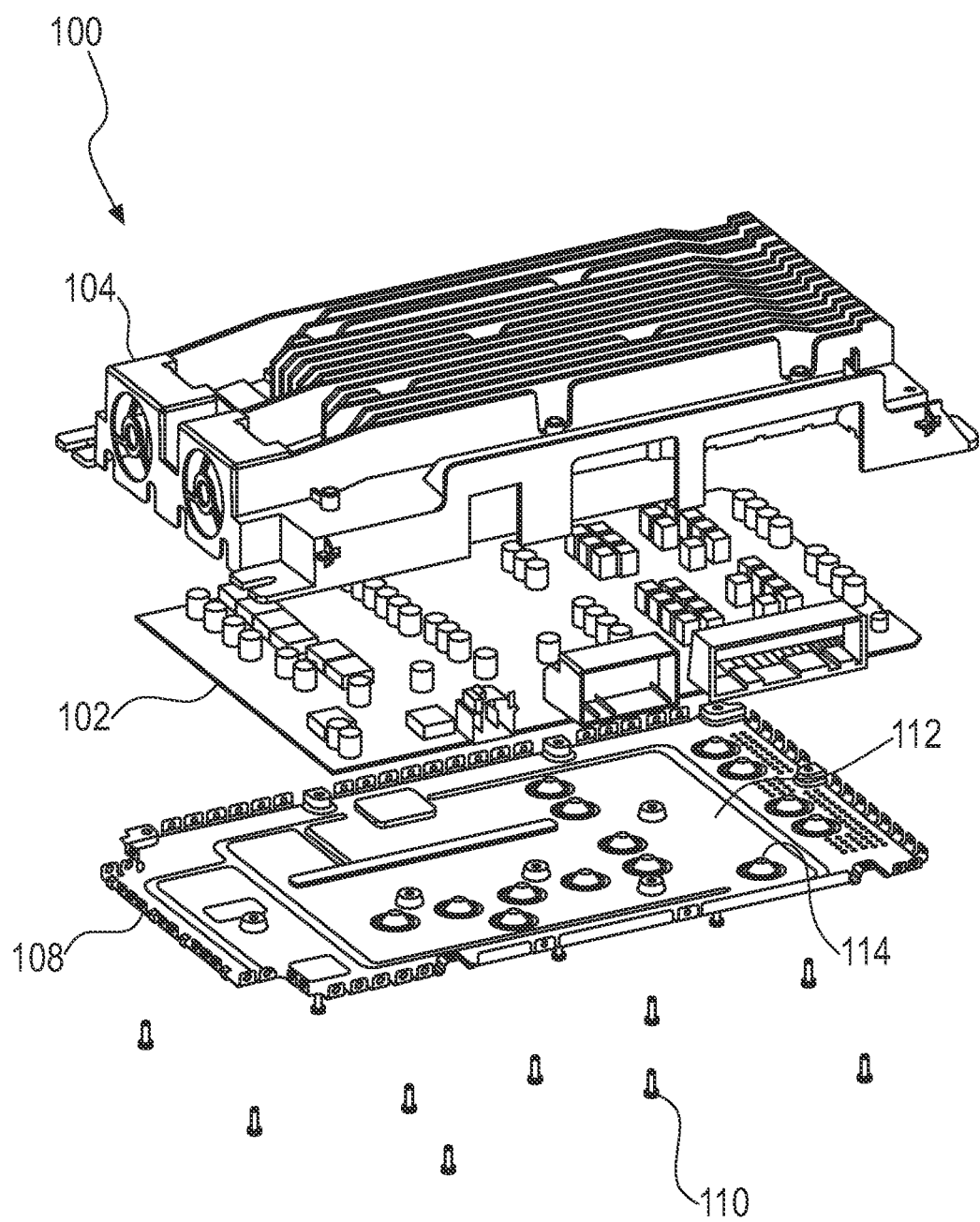
FIG. 1 shows an exploded view of an electronic appliance.

FIG. 1 shows an embodiment of an electronic appliance 100 in form of an amplifier as used, for example, in a vehicle lifestyle audio system. The electronic appliance 100 comprises a printed circuit board 102 with various electronic components such as integrated circuits, a heat sink 104 with cooling fins 106 arranged on the side opposite to the printed circuit board 102, and a cover 108. The electronic components are arranged on the printed circuit board 102 opposite to the cover, facing the heat sink 104. The cover 108 and the heat sink 104 are attached to the printed circuit board 102 by screws or similar. Only the screws 110 for attaching the cover 108 to the printed circuit board 102 are shown in FIG. 1 for illustrative purposes. The heat sink 104 may be made of aluminum. The cover 108 may be made of stainless steel.

The cover 108 comprises a metal sheet 112 and several domes 114 pointing towards the printed circuit board 102. The domes 114 may be provided in the metal sheet 112 by embossing. The domes 114 are arranged in the metal sheet 112 in a way, which is described in more detail below. When assembled, the printed circuit board 102 is sandwiched between the heat sink 104 and the cover 108 such that the domes 114 of the cover 108 exert pressure onto the specific locations on the lower side of the printed circuit board 102 where integrated circuits and other electronic components are arranged on the upper side of the printed circuit board 102. Herein, terms "upper", "lower", "uppermost", "lowest" and similar relate to the presentation in the respective Figures. With the domes 114 exerting pressure on these specific locations the respective electronic components become pushed against the heat sink 104, and heat transfer to the heat sink and heat dissipation are supported.

Figure 2:
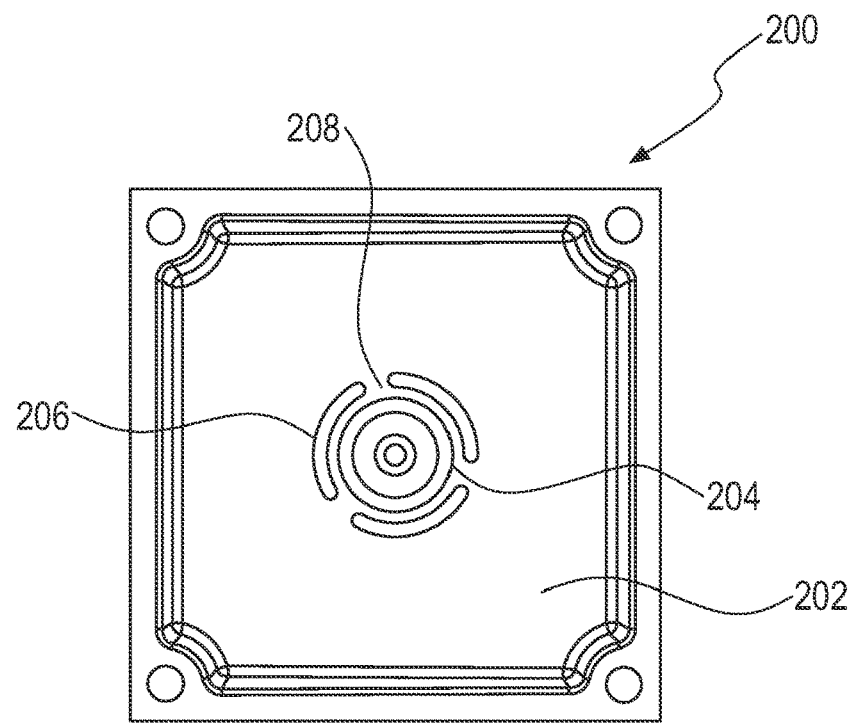
FIG. 2 shows an embodiment of a cover.
Figure 3:
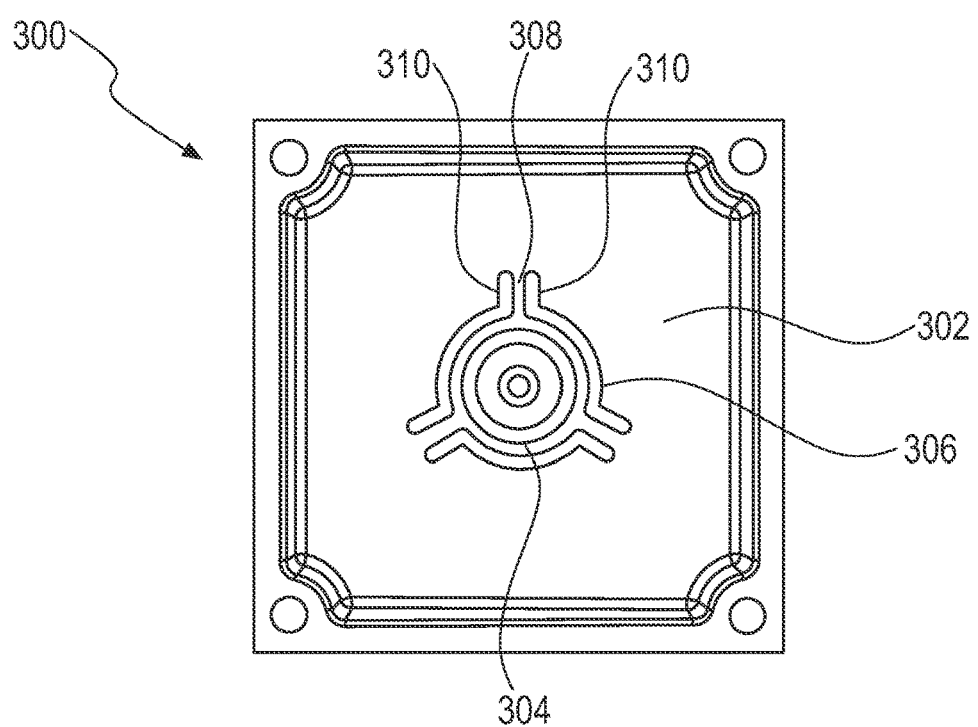
FIG. 3 shows a further embodiment of a cover.

FIG. 2 shows an embodiment of a cover 200. The cover 200 includes a metal sheet 202 and a dome 204. Several domes 204 may be provided in the metal sheet 202. In the metal sheet 202 several ring segment-shaped slits 206 are provided. The ring segment-shaped slits 206 are arranged side by side (i.e., adjacent) to each other on a circle encircling the dome 204, while being spaced apart, in particular by equal distance, such that spokes 208 remain. The spokes 208 connect the dome 204 with the (rest of the) metal sheet 202. Depending on the shape of the ends of the ring segment-shaped slits 206 the spokes 208 may extend in a radial direction, or they may be inclined/angled, bended or curved. Three ring segment-shaped slits 206 are shown in FIG. 3. However, more or less than three ring segment-shaped slits may be provided with their lengths respectively adjusted. Even the provision of one ring segment-shaped slit 206 can be conceived with its ends not connected, i.e., with its ends spaced apart and forming one spoke 208 by means of which the dome 204 is connected to the metal sheet 202. Through the provision of the ring segment-shaped slits 206 the dome 204 is flexibly suspended at the metal sheet 202 via the spokes 208. The cover 200 may be made of stainless steel.

FIG. 3 shows an embodiment of a cover 300 that corresponds to the cover 200 but where in addition to the ring segment-shaped slits 306 slit extensions 310 are provided in the metal sheet 302. At both ends of each ring segment-shaped slit 306 a slit extension 310 is provided that points away from the dome 304, in particular in a radial direction. The slit extensions 310 may also extend in an inclined/angled manner. They may also be curved or bended. Slit extension 310 provided at different ends of a ring segment-shaped slit 306 may have mirror-inverted shapes, i.e., they may be axially symmetrically with respect to the radial direction/axis. Through the provision of the slit extensions 310 the spokes 308 become longer (than the spokes 208 of FIG. 2), resulting in less stiff suspension of the dome 304 in the metal sheet 302 compared with the dome 204 of the cover 200 shown in FIG. 2 (see also the comparison in FIG. 9).

Figure 4:
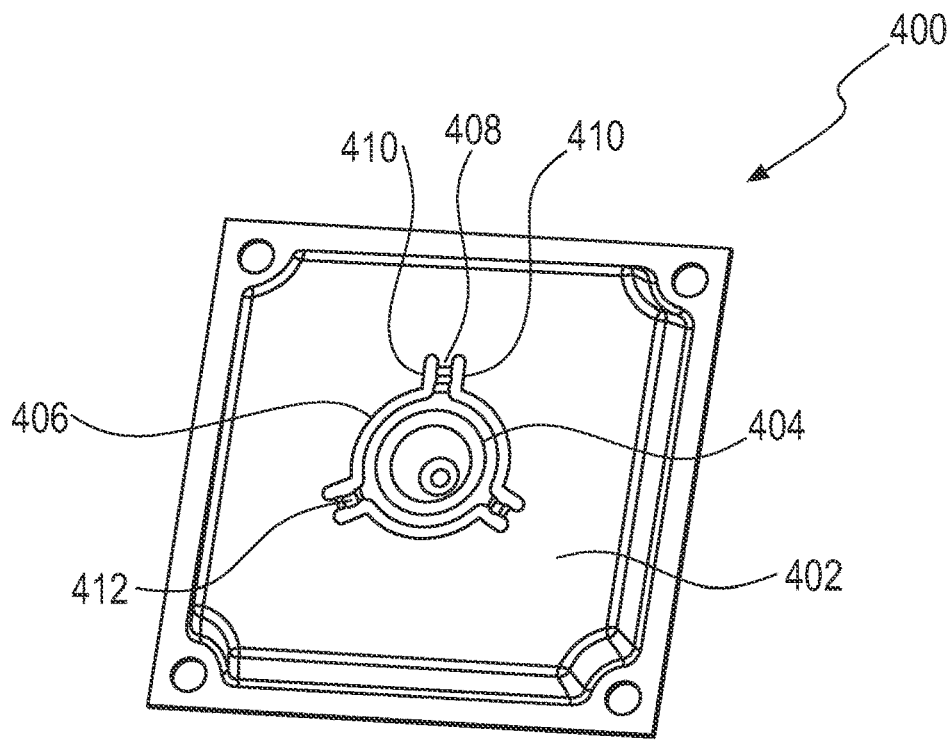
FIG. 4 shows a further embodiment of a cover.

FIG. 4 shows an embodiment of a cover 400 that corresponds to the cover 300 shown in FIG. 3 but where in addition a groove 412 is provided between adjacent slit extensions 410 of two neighboring ring segment-shaped slits 406. The groove 412 may connect the adjacent slit extensions 410 of neighboring ring segment-shaped slits 406. The grooves 412 are provided in the metal sheet 402 in the spokes 408 between the adjacent slit extensions 410. The longitudinal direction of the grooves 412 may be perpendicular to the longitudinal direction of the slit extensions 410. The grooves 412 are indented in the same direction as each dome 404 that is provided in the metal sheet 402. The grooves 412 may be provided in the metal sheet 402 by embossing. The provision of the grooves 412 in the spokes 408 results in even less stiff suspension of the dome 404 in the metal sheet 402 compared with the dome 304 of the cover 300 shown in FIG. 3 (see also the comparison in FIG. 9).

Figure 5:
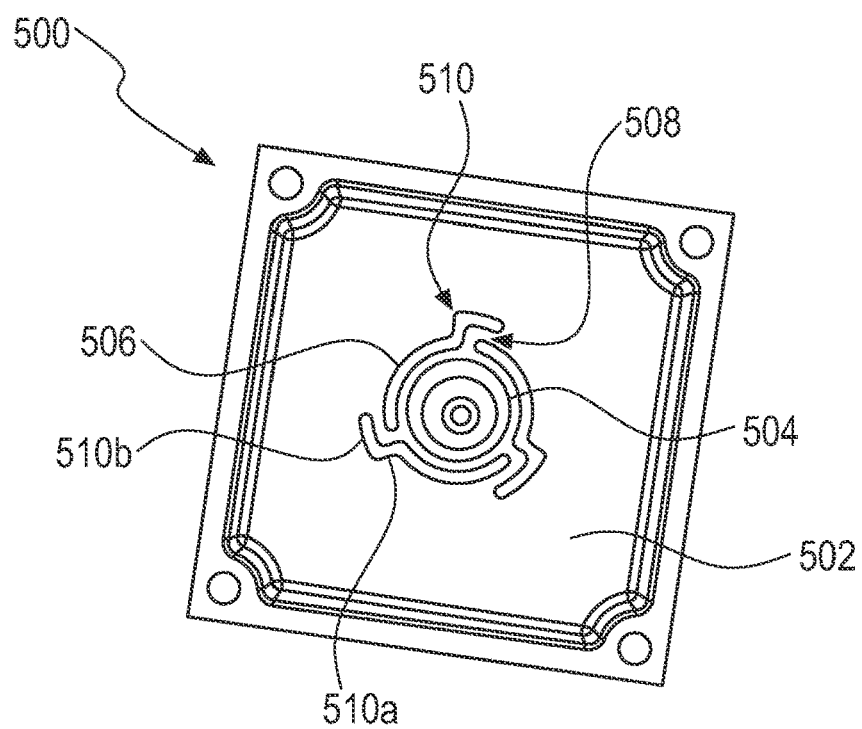
FIG. 5 shows a further embodiment of a cover.

FIG. 5 shows an embodiment of a cover 500 that corresponds to the cover 200 shown in FIG. 2 but where in addition a slit extension 510 is provided only at one end of each ring segment-shaped slit 506. The end of each ring segment-shaped slit 506 at which the slit extension 510 is provided may be the same end for each ring segment-shaped slit 506. The slit extension 510 at least in part points away from the dome 504. In relation to the dome 504, the slit extension 510 extends on the opposite side of the ring segment-shaped slit 506. Each slit extension 510 is formed such that at least part of it encircles the neighboring ring segment-shaped slit 506 at least partially, while being spaced apart from the neighboring ring segment-shaped slit 506. For this the slit extension 510 of each ring segment-shaped slit 506 may include a first slit extension part 510a and a second slit extension part 510b.

The first slit extension part 510a may extend in a radial direction away from the dome 504. The first slit extension part 510a may also extend in an inclined/angular manner. It may also be bend or curved. The second slit extension part 510b may extend from that end of the first slit extension part 510a that is opposite to the end of the first slit extension part 510a that is connected to the respective ring segment-shaped slit 506. I.e., the second slit extension part 510b is connected to that end of the first slit extension part 510a that is not directly connected to the ring segment-shaped slit 506. The second slit extension part 510b may have a ring segment shape, which is similar to the shape of the ring segment-shaped slits 506 but may be shorter, and may extend in parallel or helically to but spaced apart from the neighboring ring segment-shaped slit 506. The cover 500 shown in FIG. 5 exhibits even less stiff suspension of the dome 504 in the metal sheet 502 compared with the dome 404 of the cover 400 shown in FIG. 4 (see also the comparison in FIG. 9).

Figure 6:
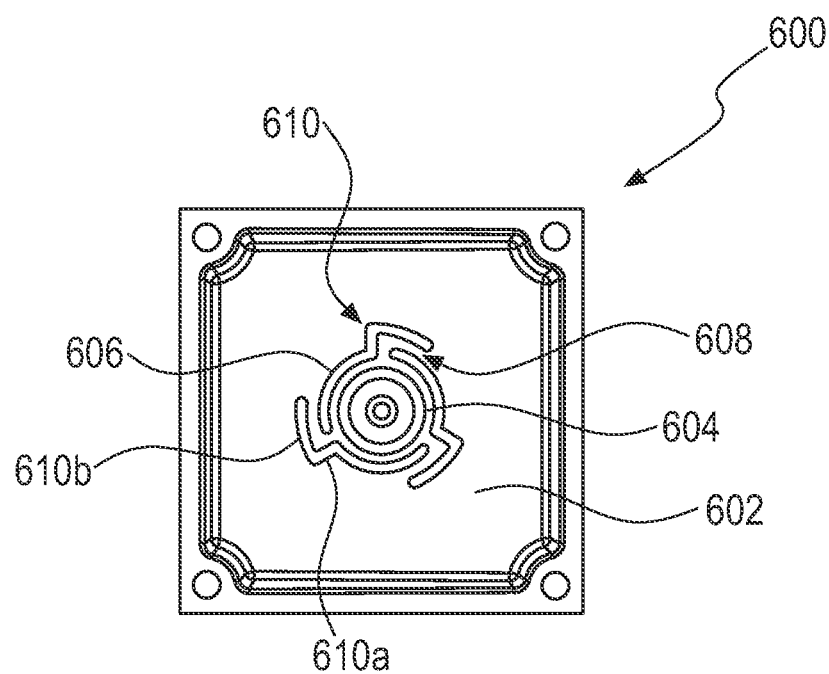
FIG. 6 shows a further embodiment of a cover.

The cover 600 shown in FIG. 6 corresponds to the cover 500 shown in FIG. 5 with the difference that the second slit extension part 610b of the cover 600 is longer than the second slit extension part 510b of the cover 500. I.e., the second slit extension part 610b of the cover 600 encircles more of the neighboring ring segment-shaped slit 606 than the second slit extension part 510b of the embodiment shown in FIG. 5. This results in the cover 600 shown in FIG. 6 exhibiting even less stiff suspension of the dome 605 in the metal sheet 602 compared with the dome 504 of the cover 500 shown in FIG. 5 (see also the comparison in FIG. 9). The first slit extension part 610a of FIG. 6 may correspond to the first slit extension part 510a of FIG. 5. The slit extensions 510, 610, in particular their second slit extensions parts 510b, 610b may encircle less that half of the length of the neighboring ring segment-shaped slit 506, 606.

Figure 7:
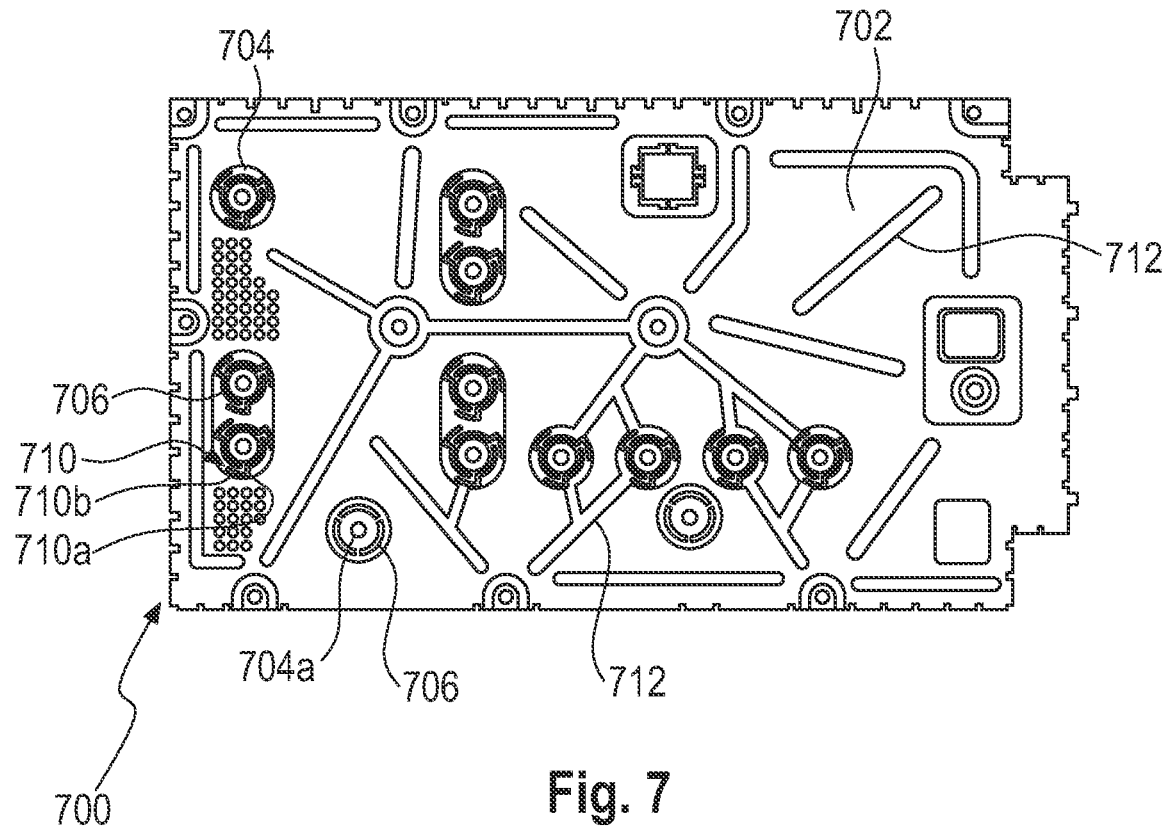
FIG. 7 shows a further embodiment of a cover.

FIG. 7 shows a cover 700 with several domes 704 provided in the metal sheet 702. Each dome 704 is surrounded by ring segment-shaped slits 706 that may correspond to the ring segment-shaped slits 606 of the cover 600 shown in FIG. 6. The ring segmented-shaped slits 706 are provided with slit extensions 710 that include a first slit extension part 710a and a second slit extension part 710b. The slit extension 710, the first slit extension part 710a and the second slit extension part 710b of the cover 700 may correspond to the slit extension 610, the first slit extension part 610a and the second slit extension part 610b of the cover 600 shown in and described in connection with FIG. 6. Some domes of the cover 700 may also be provided with other combinations of ring segment-shaped slits and slit extensions as shown in and described in connection with FIGS. 3 to 5. Furthermore, domes 704a may be provided in the metal sheet 702 that may be provided with ring segment-shaped slits 706 without slit extensions. Moreover, ribs 712 may be provided in the metal sheet 702 to improve stiffness of the metal sheet 702 of the cover 700.

Figure 8:
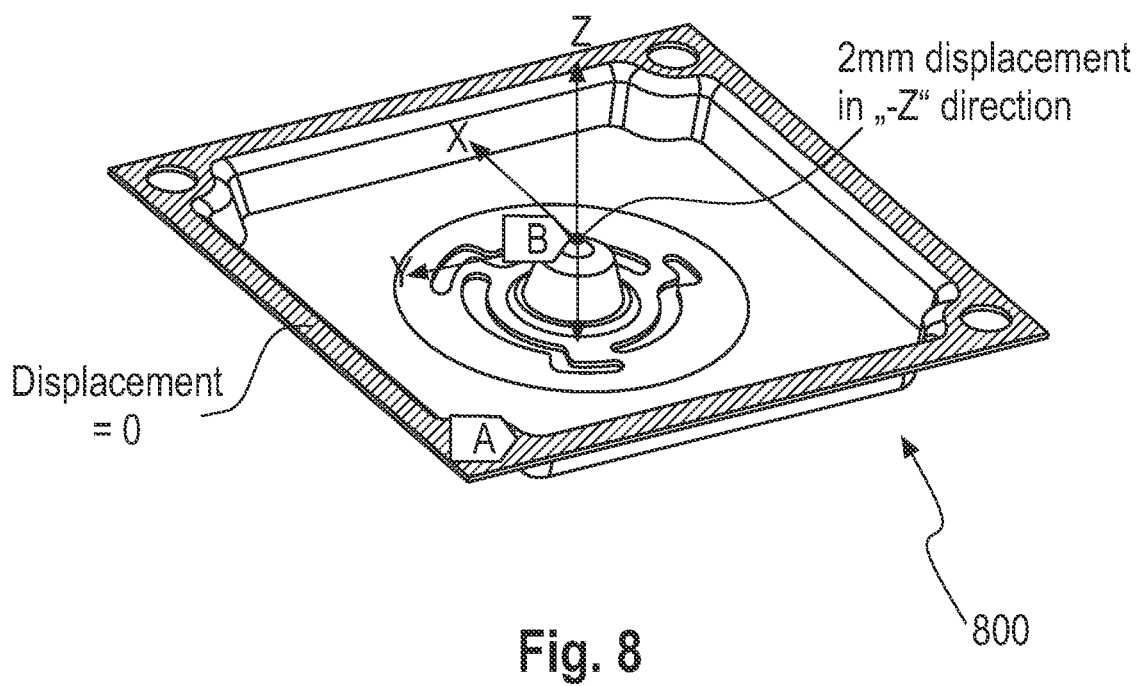
FIG. 8 shows the cover of FIG. 5 with displaced dome.
Figure 9:
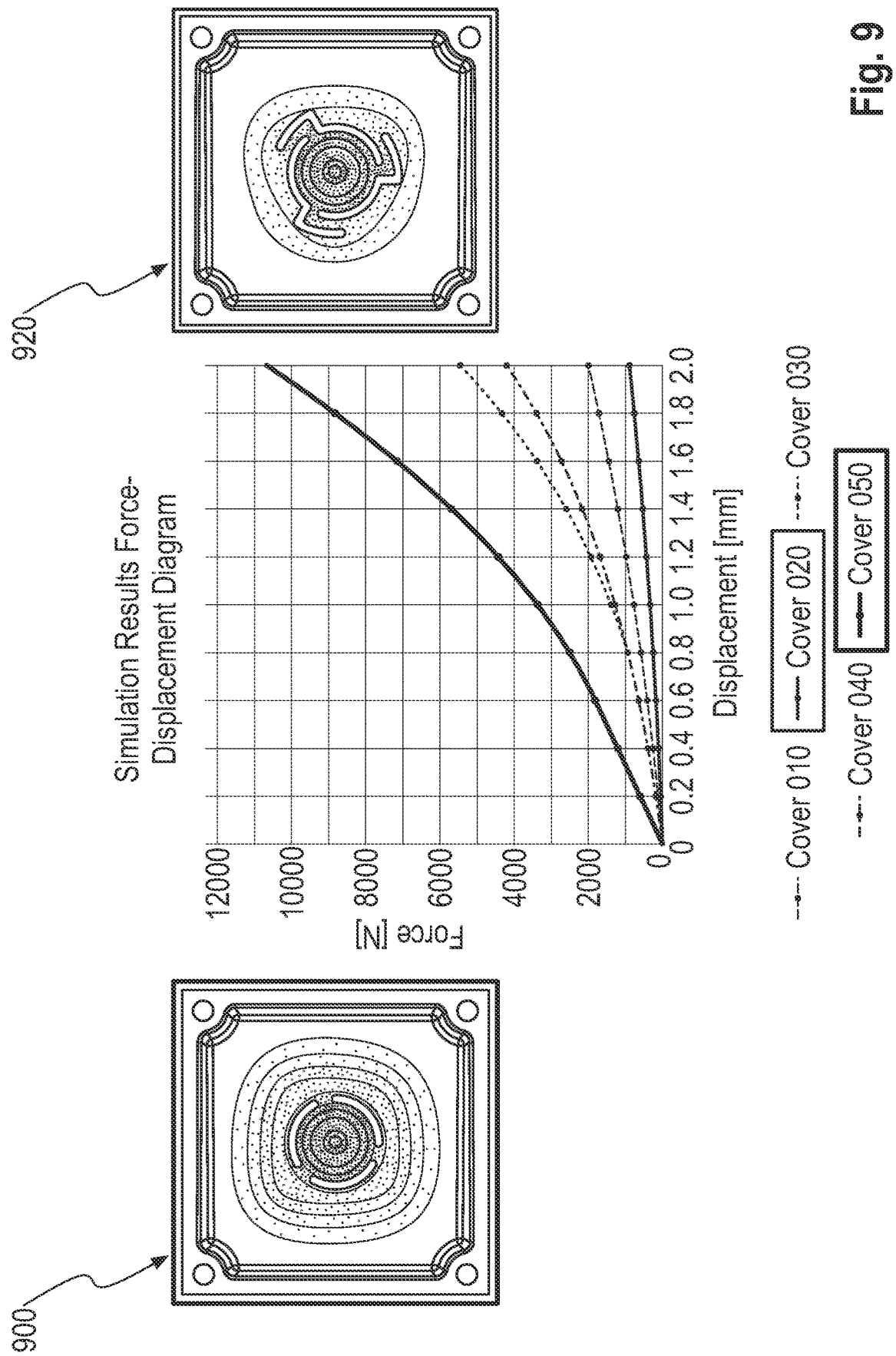
FIG. 9 shows a comparison of the resulting pressure exerted by the respective domes of the covers shown in FIGS. 1 to 6, when the domes are displaced as shown in FIG. 8.

FIG. 9 shows resulting pressures/compressive forces/spring forces when the domes 204, 304, 404, 504, 604 of the covers 200, 300, 400, 500, 600 are displaced (pushed down) by a certain amount in the z direction, the z direction being the direction that is perpendicular to the plane of the metal sheet 202, 302, 402, 502, 602 (assuming no warping/distortion or other displacement of the metal sheet). FIG. 8 shows a cover 800 with axes x, y, z of a Cartesian coordinate system added. The cover 800 exemplarily corresponds to the cover 500 shown in FIG. 5 displayed top down, but may be each of the covers 200, 300, 400, 500, 600.

In FIG. 9 the cover 900 shown on the left-hand side corresponds to the cover 200 depicted in FIG. 2, and the cover 920 shown on the right-hand side corresponds to the cover 600 depicted in FIG. 6. In the diagram the abscissa represents the degree of dome displacement in mm, and the ordinate represents the resulting pressure/compressive force/spring force in N. The uppermost curve shows the resulting spring force for the dome of the cover 900 (i.e., the dome 204 of the cover 200 shown in FIG. 2, also called "Cover 050" in FIG. 9). The second uppermost curve shows the resulting spring force for the dome 304 of the cover 300 shown in FIG. 3 (also called "Cover 030" in FIG. 9). The middle curve shows the resulting spring force for the dome 404 of the cover 400 shown in FIG. 4 (also called "Cover 040" in FIG. 9). The second lowest curve shows the resulting spring force for the dome 504 of the cover 500 shown in FIG. 5 (also called "Cover 010" in FIG. 9). The lowest curve shows the resulting spring force for the dome of the cover 920 (i.e., the dome 604 of the cover 600 shown in FIG. 6, also called "Cover 020" in FIG. 9).

In line with the above description of FIGS. 2 to 6, the dome of the cover 900 exhibits the highest spring force, i.e., the highest stiffness, and, thus, the lowest flexibility when displaced, whereas the dome of the cover 920 exhibits the lowest spring force, i.e., the lowest stiffness, and, thus, the highest flexibility when displaced. This makes the cover 920 especially suitable for pressing printed circuit boards with electronic components that may have different heights against heat sinks for safe heat transfer and dissipating, while at the same time ensuring little or no warping of the metal sheet of the cover.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

While the preceding is directed to embodiments of the present disclosure, other and further embodiments of the disclosure may be devised without departing from the basic scope thereof, and the scope thereof is determined by the claims that follow.

What is claimed is:

1. A cover for pressing a printed circuit board on a heat sink, the cover comprising:
    a metal sheet; and
    one or more domes arranged in the metal sheet;
        wherein:
            each dome is associated with one or more slits in a shape of ring segments in the metal sheet, the ring segment-shaped slits being provided in the metal sheet side-by-side and spaced apart from each other, the ring segment-shaped slits surrounding the dome they are associated with,
            a first slit extension is provided in the metal sheet at a first end of a first slit in the one or more slits,
            a second slit extension is provided in the metal sheet at one of a second end of the first slit or a first end of a second slit in the one or more slits, and
            a groove is provided in the metal sheet that connects the first slit extension and the second slit extension.

2. The cover of claim 1, wherein at least at one end of each ring segment-shaped slit, a slit extension is provided in the metal sheet, the slit extension at least in part pointing away from the dome the ring segment-shaped slit is associated with.

3. The cover of claim 2, wherein the slit extensions are provided at same ends of the ring segment-shaped slits.

4. The cover of claim 2, wherein a slit extension is provided at both ends of each ring segment-shaped slit.

5. The cover of claim 4, wherein the slit extensions extend in a radial direction away from the dome the ring segment-shaped slit is associated with.

6. The cover of claim 4, wherein the first slit extension and the second slit extension are slit extensions of neighboring ring segment-shaped slits, a longitudinal direction of the groove is perpendicular to the longitudinal direction of the first and second slit extensions, wherein the groove is indented in the same direction as each dome.

7. The cover of claim 1, wherein the metal sheet and the one or more domes form one piece.

8. An electronic appliance comprising:
    a heat sink;
    an electronic circuit board; and
    a cover comprising a metal sheet and one or more domes arranged in the metal sheet;
    wherein:
        each dome is associated with one or more slits in a shape of ring segments in the metal sheet, the ring segment-shaped slits being provided in the metal sheet side-by-side and spaced apart from each other, the ring segment-shaped slits surrounding the dome they are associated with,
        the electronic circuit board is sandwiched between the cover and the heat sink such that the domes of the cover press the electronic circuit board on the heat sink,
        a first slit extension is provided in the metal sheet at a first end of a first slit in the one or more slits,
        a second slit extension is provided in the metal sheet at one of a second end of the first slit or a first end of a second slit in the one or more slits, and
        a groove is provided in the metal sheet that connects the first slit extension and the second slit extension.

9. The electronic appliance of claim 8, wherein at least at one end of each ring segment-shaped slit, a slit extension is provided in the metal sheet, the slit extension at least in part pointing away from the dome the ring segment-shaped slit is associated with.

10. The electronic appliance of claim 9, wherein the slit extensions are provided at same ends of the ring segment-shaped slits.

11. The electronic appliance of claim 9, wherein a slit extension is provided at both ends of each ring segment-shaped slit.

12. The electronic appliance of claim 11, wherein the slit extensions extend in a radial direction away from the dome the ring segment-shaped slit is associated with.

13. The electronic appliance of claim 11, wherein the first slit extension and the second slit extension are slit extensions of neighboring ring segment-shaped slits, a longitudinal direction of the groove being perpendicular to the longitudinal direction of the first and second slit extensions, wherein the groove is indented in the same direction as each dome.

14. The electronic appliance of claim 8, wherein the metal sheet and the one or more domes form one piece.

* * * * *